(12) United States Patent
Yamada et al.

(10) Patent No.: US 8,118,935 B2
(45) Date of Patent: *Feb. 21, 2012

(54) MIXING BOX, AND APPARATUS AND METHOD FOR PRODUCING FILMS

(75) Inventors: Takakazu Yamada, Shizuoka-ken (JP); Takeshi Masuda, Shizuoka-ken (JP); Masahiko Kajinuma, Shizuoka-ken (JP); Masaki Uematsu, Shizuoka-ken (JP); Koukou Suu, Chiba-ken (JP)

(73) Assignee: ULVAC, Inc., Kanagawa (JP)

( * ) Notice: Subject to any disclaimer, the term of this patent is extended or adjusted under 35 U.S.C. 154(b) by 1284 days.

This patent is subject to a terminal disclaimer.

(21) Appl. No.: 11/132,173

(22) Filed: May 19, 2005

(65) Prior Publication Data
US 2005/0211168 A1    Sep. 29, 2005

Related U.S. Application Data

(62) Division of application No. 10/466,324, filed on Jul. 29, 2003, now Pat. No. 6,933,010.

(30) Foreign Application Priority Data

Dec. 3, 2001 (JP) .................................. 2001-369279
Jan. 22, 2002 (JP) .................................. 2002-012566

(51) Int. Cl.
*C23C 16/455* (2006.01)
*C23C 16/00* (2006.01)
*H01L 21/306* (2006.01)

(52) U.S. Cl. .............. 118/715; 156/345.29; 156/345.33; 156/345.34

(58) Field of Classification Search .................. 118/715; 156/345.33, 345.29, 345.34
See application file for complete search history.

(56) References Cited

U.S. PATENT DOCUMENTS

| | | | |
|---|---|---|---|
| 5,728,223 A | 3/1998 | Murakami et al. | |
| 5,785,796 A * | 7/1998 | Lee | 156/345.24 |
| 5,846,332 A | 12/1998 | Zhao et al. | |
| 6,179,920 B1 * | 1/2001 | Tarutani et al. | 118/715 |
| 6,312,526 B1 | 11/2001 | Yamamuka et al. | |
| 6,461,972 B1 * | 10/2002 | Kabansky | 438/710 |
| 6,641,698 B2 * | 11/2003 | Kabansky | 156/345.35 |
| 6,716,287 B1 | 4/2004 | Santiago et al. | |

(Continued)

FOREIGN PATENT DOCUMENTS
EP    537854 A1    4/1993
(Continued)

*Primary Examiner* — Jeffrie R Lund
(74) *Attorney, Agent, or Firm* — Arent Fox LLP

(57) ABSTRACT

A thin film manufacturing system, wherein a stage for placing a substrate thereon is disposed within a vacuum reactor and a gas head for supplying a film forming gas to a central area on a top face of the vacuum reactor is arranged so that the gas head is opposed to the stage. A cylindrical sleeve member is disposed and comes in close contact with a side wall of the stage to surround a periphery of the stage. The height of the stage can be established at the position where the volume of a second space formed below the stage and connected to a vacuum discharge means is larger than that of a first space formed above the stage, in such a manner that an exhaust gas is isotropically discharged from the first space without causing any convection current therein through the interstice between the sleeve member and an inner wall surface constituting the reactor.

7 Claims, 6 Drawing Sheets

U.S. PATENT DOCUMENTS

| | | | |
|---|---|---|---|
| 6,933,010 B2 * | 8/2005 | Yamada et al. | 427/248.1 |
| 2003/0198741 A1 * | 10/2003 | Uchida et al. | 427/248.1 |
| 2004/0028810 A1 * | 2/2004 | Grant et al. | 427/248.1 |
| 2004/0089235 A1 * | 5/2004 | Yamada et al. | 118/715 |
| 2005/0211168 A1 * | 9/2005 | Yamada et al. | 118/715 |

FOREIGN PATENT DOCUMENTS

| | | |
|---|---|---|
| JP | 59-49829 | 3/1984 |
| JP | 61-002318 | 1/1986 |
| JP | 2-146423 | 12/1990 |
| JP | 3-2377 A | 1/1991 |
| JP | 5-45382 Y2 | 11/1993 |
| JP | 7-150359 A | 6/1995 |
| JP | 7-211643 A | 8/1995 |
| JP | 3081860 | 3/2000 |
| JP | 2002-1098 A | 1/2002 |

* cited by examiner

← ─── } Reactive Gas
◁ ─·─ } Vaporized Gas
⬭ Region Relatively Rich in Reactive Gas
⬭ Region Relatively Rich in Vaporized Gas ← ─── } Reactive Gas
◁ ─·─ } Vaporized Gas
⬭ Region Relatively Rich in Reactive Gas
⬭ Region Relatively Rich in Vaporized Gas

MIXING BOX, AND APPARATUS AND METHOD FOR PRODUCING FILMS

CROSS-REFERENCE TO RELATED APPLICATION

This is a Division of application Ser. No. 10/466,324 filed Jul. 29, 2003 now U.S. Pat. No. 6,933,010. The disclosure of the prior application is hereby incorporated by reference herein in its entirety.

TECHNICAL FIELD

The present invention relates to a mixing box (chamber), a thin film-manufacturing system (apparatus) and a method for producing (depositing) a thin film and, in particular, the present invention relates to a mixing box used in the production (deposition) of a thin film according to the CVD process such as the MOCVD process, a thin film-manufacturing system equipped with this mixing box and a method for depositing a thin film.

BACKGROUND ART

There have conventionally been used a simple box-like mixing box as a mixing box for admixing a plurality of gases having different masses. In the case of such a conventional mixing box, the internal volume of the box should be changed depending on the flow rates and kinds of material gases and reactive gases and therefore, it is necessary to use a larger mixing box as the molecular weight ratio of the material gases (raw gases) to the reactive gas increases.

In general, when forming a thin film according to the CVD process such as the MOCVD process, a film-forming gas (a film-depositing gas) comprising vaporized gases and reactive gases is introduced into a vacuum-processing chamber serving as a reactor (a reaction chamber). However, it is necessary to establish the uniform distribution of the flow rate and concentration of the film-forming gas as well as the uniform temperature distribution just above a substrate in order to form a thin film having uniform film quality and uniform film thickness distribution. To establish a uniform film-forming gas stream, the formation of any turbulent flow whose control is quite difficult should be prevented. Thus, the vaporized gas and the reactive gas are uniformly admixed together prior to the introduction of the mixture thereof into the reactor to thus feed the same to the surface of the substrate. For this reason, the vaporized gas and reactive gas are uniformly admixed together in a mixing box equipped with a slit and then introduced into the reactor and fed to the area proximity to the substrate.

Alternatively, there has also been proposed a method comprising the steps of feeding a vaporized gas and a reactive gas to a region proximity to a substrate in a reactor and mixing these gases therein to form a uniform film-forming gas.

Moreover, when feeding material gases using a system for vaporizing liquid materials, the pressure within the vaporization system greatly affects, for instance, the stable vaporization of the liquid (raw) materials, the formation of residue and the service life of the vaporizer and therefore, it has in general been recognized that the pressure within the vaporizer is preferably as low as possible. For this reason, the pressure within the mixing box has conventionally been reduced to a level as low as possible so as to reduce the pressure within the vaporization chamber In such conventional techniques, however, the following problems arise. If the size of the mixing box increases in the conventional mixing box, the mixing box cannot directly be connected to the reactor from the viewpoint of the structures thereof or the mixing box and the reactor should be kept apart from each other. If they are arranged while they are kept apart from one another, the path for the introduction of the film-forming gas becomes too long and the uniformly admixed film-forming gas would again be converted into a laminar flow during the introduction thereof into the reactor and supply thereof to the region above a substrate in a reactor. For this reason, the mixing box should have a limited size such that it can directly be connected to the reactor and the size of the former cannot be increased at any time.

On the other hand, when increasing the size of a conventional mixing box, a problem arises such that the gas mixture comprising a vaporized gas and a reactive gas becomes a laminar flow when the molecular weight of the vaporized gas is greatly different from that of the reactive gas, in the mixing box having a conventionally known structure, and that it is quite difficult to uniformly admix these gases.

When admixing the vaporized gas (raw gas) and the reactive gas in a mixing box provided with a conventional slit and when the molecular weight of the former is greatly different from that of the latter, the resulting mixed gas may pass through the slit while maintaining the laminar flow condition. Thus, it has been needed to use a complicated mechanism for, for instance, rotating the slit and therefore, there has been desired for the development of a mixing box having a simple structure of construction.

Moreover, in the case of the foregoing method in which a uniform film-forming gas is prepared by admixing vaporized gases (raw material) and reactive gases in the proximity to a substrate, a turbulent flow is formed by the injection of the vaporized gas and it becomes impossible to control the film-forming gas flow comprising the vaporized gases and reactive gases. This accordingly results in a problem such that the thin film formed on the substrate is deteriorated in, for instance, the film quality and the film thickness distribution.

Moreover, when supplying a deposit gas to a reactor using the foregoing system for vaporizing the liquid materials and when using a conventional mixing box, it is quite difficult to design the box in such a manner that an internal pressure thereof can be reduced. For this reason, when the pressure within the mixing box is high, even if the vaporized gas can uniformly be admixed with the reactive gas, the pressure within the vaporizer on its primary side is necessarily high and a problem accordingly arises such that an unstable film-forming gas is introduced into the reactor, a large amount of residue is formed and the maintenance cycle of the vaporization region is shortened.

Incidentally, a CVD system is employed for forming or depositing a desired thin film on a substrate such as a silicon wafer and has a vacuum reactor equipped with a vacuum exhaust means. A stage on which a substrate is placed is arranged in the interior of the vacuum reactor and a gas head is placed at the upper portion of the reactor in such a manner that it is opposite to the stage. A reactive gas and a vaporized gas (raw gas) are fed to a gas-mixing box fitted to this gas head through a gas piping work. When forming a thin film, a mixed gas (film-forming gas) comprising a reactive gas and a vaporized gas mixed together in a desired mixing ratio is introduced into the vacuum reactor, which is maintained at a desired degree of vacuum, through the gas head to induce a gas phase chemical reaction and to thus form a desired thin film on the substrate. In this respect, the exhaust gas containing, for instance, the mixed gas, which does not contribute to the film-forming process, is discharged to the exterior by a vacuum exhaust means.

In this case, to make, the uniform, the distribution of the film thickness and that of the composition of the thin film formed on the substrate and to improve the reproducibility thereof, one should make, uniform, the flow of the mixed gas in the vacuum reactor. In this respect, if a non-uniform flow of the mixed gas is established in the vacuum reactor and a film grows on the inner wall of the vacuum reactor, not only the maintenance of the reactor should frequently be carried out, but also the dust of films thus formed may adversely affect the CVD process.

Thus, in the CVD process in which a mixed gas is introduced into a vacuum reactor while evacuating the same with a vacuum exhaust means, it is necessary to prevent the occurrence of any uncontrollable convection current and turbulent flow in the vacuum reactor. To this end, it is quite important to subject the exhaust gas to isotropic discharge from the peripheral region of the substrate. Moreover, when the CVD process is carried out while applying heat, the occurrence of any heat convection would make the gas flow non-uniform and therefore, one should devise a measure to inhibit the occurrence of any heat convection.

As an example of the means for solving these problems concerning, for instance, the flows of mixed gases and exhaust gases, there has conventionally been proposed a technique in which a fin is fitted to a stage and the stage is rotated during the formation of a film to thus minimize the influence of, for instance, any turbulent flow, convection current and heat convection (see Japanese Un-Examined Patent Publication No. Sho 61-2318). In this case, however, if a system for rotating the stage is placed within the vacuum reactor, a problem arises such that not only the structure of the CVD system becomes complicated, but also the production cost of the film increases. Moreover, in this case, a substrate should be transported to the stage while going round the fin and therefore, a complicated substrate-transporting means should thus be used.

In addition to the foregoing, there has conventionally been known a single wafer-processing type CVD system equipped with a load-lock chamber. According to this system, however, a port for transporting substrates, provided with a gate valve, is positioned on the upper side of the stage and therefore, a problem arises such that the presence of this port for transporting substrates becomes a cause of convection current and/or turbulent flow. In this case, the vacuum reactor may be enlarged to make the influence of such convection current and/or turbulent flow small. However, a new problem arises such that a vacuum pump having a high evacuation ability should be used and that this method is economically unfavorable and runs counter to the recent requirement for the miniaturization of the system.

Accordingly, it is an object of the present invention to solve the problems associated with the foregoing conventional techniques and more particularly to provide a mixing box, which has a simple structure, whose voluminal size is not influenced by the flow rate and kind of the gas to be introduced into the same and which can uniformly admix a plurality of gases having different molecular weights in a high efficiency under a low pressure; a thin film-manufacturing system, which is provided with this mixing box, has a simple structure, permits the deposition of a thin film at a low cost and which can suppress any occurrence of a turbulent flow, a convection flow and heat convection to thus make the flow of the mixed gas uniform; and a method for preparing a thin film.

DISCLOSURE OF THE INVENTION

Thus, the mixing box of the present invention developed for the achievement of the foregoing object comprises a stirring chamber for stirring and mixing gases in which two gas-introduction pipes for introducing gases having different masses are arranged in such a manner that the gas-introduction inlets thereof are opposed to one another and a diffusion chamber for diffusing a gas mixture formed by the stirring and mixing operations in the stirring chamber, wherein a partition plate is positioned between the stirring chamber and the diffusion chamber in such a manner that the volume of the diffusion chamber is larger than that of the stirring chamber, wherein a gas-supply opening is arranged, on the partition plate, at a desired position on the lower side of the direction perpendicular to the straight line connecting the gas-introduction inlets and wherein the mixed gas is diffused from the stirring chamber to the diffusion chamber through the gas-supply opening.

The mixing box according to the present invention is designed in such a manner that a gas mixture formed by stirring and admixing a plurality of gases in the stirring chamber diffuses into the diffusion chamber through the gas-supply opening formed at a desired position on the partition plate and thus a plurality of gases can uniformly be admixed together without using a mixing box having a large volume even when the molecular weights of the gases introduced are greatly different from one another. Therefore, according to the mixing box of the present invention, it is not needed to change the volume of the mixing box depending on the flow rates and kinds of a plurality of gases having greatly different molecular weights, when admixing the plurality of gases. For this reason, the mixing box can directly and efficiently be connected to the processing bath or chamber required for the subsequent step. Accordingly, the uniformly admixed gas is never returned to its laminar flow state when it is used in the subsequent step. Each gas component introduced into the stirring chamber of the mixing box moves along, for instance, the surface of the partition plate having a shape as will be detailed below to thus generate a convection current and as a result, the gas mixture introduced into the stirring chamber can highly efficiently, certainly and uniformly be stirred and admixed therein. Moreover, the appropriate control of the position and size of the foregoing gas-supply opening would permit the optimum stirring and mixing of the gases introduced into the chamber and as a result, these gas components can be introduced into the diffusion chamber in the form of a uniformly admixed gas mixture.

The partition plate arranged in the mixing box of the present invention has a shape of a curve of second degree, which is convex with respect to the bottom of the mixing box. As has been discussed above in detail, a desired mixing box having a quite simple structure can be obtained simply by arranging a partition plate having a desired curved surface in the mixing box.

In addition, the gas-supply opening formed on the partition plate of the mixing box according to the present invention is designed such that a pressure difference is established between the stirring chamber and the diffusion chamber by appropriately selecting the position and the size of the opening, that the gases having different molecular weights are uniformly admixed together due to a strong convection current thus generated in the stirring chamber and that the mixed gas thus formed is diffused from the stirring chamber to the diffusion chamber having a wider space. For instance, this gas-supply opening is preferably arranged at a position corresponding to ½ time the vertical distance from the periphery of the foregoing partition plate to the bottom thereof. Thus, the uniformly admixed gas mixture can efficiently be diffused from the stirring chamber to the diffusion chamber.

The foregoing two gas-introduction pipes may comprise, for instance, a vaporized gas-introduction pipe and a reactive gas-introduction pipe and the mixed gas may be a film-forming gas consisting of a vaporized gas and a reactive gas.

To accomplish the foregoing object, a first thin film-manufacturing system according to the present invention comprises a mixing box, which comprises a stirring chamber for stirring and mixing gases in which a vaporized gas-introduction pipe and a reactive gas-introduction pipe for introducing gases having different masses are arranged in such a manner that the gas-introduction inlets thereof are opposed to one another and a diffusion chamber for diffusing a film-forming gas consisting of the vaporized gas and the reactive gas and formed by the stirring and mixing operations in the stirring chamber, and a vacuum reactor directly connected to the diffusion chamber of the mixing box, wherein the mixing box is designed in such a manner that a partition plate is positioned between the stirring chamber and the diffusion chamber in such a manner that the volume of the diffusion chamber is larger than that of the stirring chamber, that a gas-supply opening is arranged, on the partition plate, at a desired position on the lower side of the direction perpendicular to the straight line connecting the gas-introduction inlets and that the film-forming gas diffuses from the stirring chamber to the diffusion chamber through the gas-supply opening. In this connection, it is preferred that this partition plate is one having a shape similar to that specified above and that the gas-supply opening is arranged at a position likewise similar to that specified above.

According to the first thin film-manufacturing system, a film-forming gas formed by the stirring and mixing operations in the stirring chamber of the mixing box is then introduced into the gas-diffusion chamber, wherein the film-forming gas is diffused by the spontaneous diffusion due to the difference in volume between the stirring and diffusion chambers and thereafter the uniformly admixed film-forming gas is efficiently transferred from the diffusion chamber to the reactor. Therefore, the film-forming gas is never converted into an uncontrollable turbulent flow. Accordingly, the present invention can provide a thin film-manufacturing system having a simple structure in which a vaporized gas and a reactive gas may be uniformly admixed together at a low pressure in the mixing box whose volume is not influenced by the flow rates and kinds of these gases and the uniformly admixed film-forming gas is introduced into the reactor, which is directly connected to the mixing box to thus inhibit the conversion of the film-forming gas into a turbulent flow and to improve and stabilize the quality and thickness distribution of the film to be formed on a subject.

To accomplish the foregoing object, a first method for preparing a thin film according to the present invention comprises the steps of providing a mixing box having a desired size and a hollow cylindrical shape and comprising a stirring chamber, a diffusion chamber and a partition plate for separating the stirring chamber from the diffusion chamber; introducing a vaporized gas and a reactive gas into the stirring chamber through gas-introduction inlets for the introduction of the vaporized gas and the reactive gas respectively, which are arranged in such a manner that they are opposed to one another in the upper region of the stirring chamber; stirring and admixing the vaporized gas and the reactive gas while the flow of the vaporized gas is separated by the reactive gas and the both gases flow along the surface of the partition plate; smoothly introducing the film-forming gas consisting of the admixed vaporized gas and reactive gas into the diffusion chamber through a gas-supply opening formed at a desired position on the partition plate to thus cause the diffusion of the film-forming gas therein; introducing the uniformly admixed film-forming gas thus prepared into a vacuum reactor through a gas head positioned at the upper portion of the vacuum reactor; and then forming a thin film on a substrate placed in the reactor in a vacuum. According to this first method for forming a thin film, a film-forming gas uniformly admixed can directly be introduced into the reactor. Therefore, the film-forming gas is never converted into an uncontrollable turbulent flow and this method also permits the improvement and stabilization of the quality and thickness distribution of the resulting thin film.

To accomplish the foregoing object, a second thin film-manufacturing system according to the present invention, which comprises a cylindrical vacuum reactor provided with a stage on which a substrate is placed and a gas head for introducing a mixed gas comprising a vaporized gas and a reactive gas into the vacuum reactor arranged in the central region on the upper face of the reactor and opposed to the stage, wherein a cylindrical sleeve member having a desired length is disposed while it comes in close contact with the side wall of the stage in such a manner that an exhaust gas is discharged from a first space formed by the gas head and the upper face of the stage without causing any convection current therein through the interstice between the sleeve member and the inner wall surface constituting the reactor and wherein the height of the stage can be established at the position at which the volume of a second space formed below the stage and connected to a vacuum discharge means is larger than that of the first space.

According to the second thin film-manufacturing system of the present invention, if a mixed gas is introduced, through the gas head, into the first space of the vacuum reactor in an evacuated condition for the formation of a desired thin film on a substrate, a part of the mixed gas arrives at the substrate, while the exhaust gas containing, for instance, the mixed gas, which does not contribute to the film-forming process reaches the second space through the interstice formed between the sleeve member surrounding the periphery of the stage and the inner wall surface of the vacuum reactor. Then the exhaust gas is then externally discharged by the action of an evacuation means arranged in the vacuum reactor. In this case, the second space is designed so as to have a volume larger than that of the first space. Accordingly, the exhaust gas passing through the interstice formed between the sleeve member and the inner wall surface of the vacuum reactor is subjected to isotropic evacuation through the periphery of the sleeve member. Thus, the system would permit the inhibition of the occurrence of any turbulent flow and/or convection current within the first space to thus establish a uniform gas flow within the vacuum reactor.

Moreover, if a gas ring for uniformly introducing an inert gas into the foregoing vacuum reactor along the inner wall surface of the reactor is disposed on the upper face of the reactor, the exhaust gas, which passes through the interstice formed between the sleeve member and the inner wall surface of the vacuum reactor and is then guided to the second space can more securely be subjected to isotropic discharge by the compulsory rectifying action of the inert gas introduced through the gas ring, even in the cases in which heat convection may be induced under heating conditions and accordingly, the generation of any heat convection can be controlled.

In this case, it is desirable to set up, for instance, a heating means such as a heater or a temperature control means such as a heat exchanger so that the temperature of the inert gas fed to the gas ring can arbitrarily be adjusted.

Incidentally, if a substrate-conveyer port is arranged such that it faces to the first space, convection current and/or a turbulent flow are generated due to the presence of such a substrate-conveyer port. For this reason, the foregoing stage is desirably designed so as to be able to freely go up and down between the film-forming position above the vacuum reactor and the substrate-conveying position below the vacuum reactor and to arrange the substrate-conveyer port below the port for transporting the substrate into the vacuum reactor.

Moreover, it is preferred to prevent the generation of any dust during the film-forming steps to thus freely control the temperature of the mixed gas. To this end, it is suitable to set up, for instance, a heating means such as a heater or a temperature control means such as a heat exchanger.

In this respect, it is preferred that the interstice between the foregoing sleeve member and the inner wall surface constituting the reactor is set at a level of not less than 10 mm and that the height of the sleeve member is set at a level of not less than 70 mm.

The foregoing thin film-manufacturing system is suitably applied to the technique for forming a thin film according to, in particular, the MOCVD technique.

In the second thin film-manufacturing system discussed above, it is preferred that the system is designed such that the gas head positioned at the center of the upper face of the vacuum reactor is directly connected to the diffusion chamber of the foregoing mixing box and that the mixed gas prepared in the mixing box can immediately be introduced into the vacuum reactor.

Further, to achieve the foregoing object, a second method for manufacturing a thin film according to the present invention comprises the steps of uniformly introducing an inert gas along the inner periphery of a cylindrical reactor provided therein with a stage on which a substrate is placed, through a gas ring positioned on the top of the reactor, while introducing a mixed gas comprising a vaporized gas and a reactive gas and prepared in a mixing box into the vacuum reactor through a gas head positioned at the center of the top surface of the reactor; letting an exhaust gas flow from the first space formed by the gas head and the upper face of the stage to the second space formed on the lower side of the stage through the interstice formed between the cylindrical sleeve member having a desired length and positioned close to the side wall of the stage and the inner wall surface constituting the reactor, without inducing any convection current of the exhaust gas within the first space and then discharging the exhaust gas to the exterior of the vacuum reactor; and establishing the height of the stage during the film-forming step at such a level that the volume of the second space connected to an evacuation means is greater than that of the first space to thus form or deposit a thin film on the substrate through the reaction of the vaporized gas with the reactive gas thus introduced into the reactor.

Alternatively, this second method for manufacturing a thin film also comprises the steps of providing a mixing box having a desired size and a hollow cylindrical shape and comprising a stirring chamber, a diffusion chamber and a partition plate for separating the stirring chamber from the diffusion chamber; introducing a vaporized gas and a reactive gas into the stirring chamber through gas-introduction inlets for the introduction of the vaporized gas and the reactive gas respectively, which are arranged in such a manner that they are opposed to one another in the upper region of the stirring chamber; stirring and admixing the vaporized gas and the reactive gas while the vaporized gas stream is separated by the reactive gas stream and the both gases flow along the surface of the partition plate; smoothly introducing the film-forming gas consisting of the admixed vaporized gas and reactive gas into the diffusion chamber through a gas-supply opening formed at a desired position on the partition plate to thus cause the diffusion of the film-forming gas therein; introducing the uniformly admixed gas mixture thus prepared into a vacuum reactor through a gas head positioned at the center on the upper surface of the vacuum reactor; and then forming a thin film on a substrate placed on the stage arranged within the reactor in a vacuum.

In the foregoing thin film-manufacturing method, it is preferred to adjust the flow rate of an inert gas introduced into the vacuum reactor through the gas ring to the range of from 700 to 1500 sccm. For instance, the flow rate more preferably ranges from 1000 to 1500 sccm in case where a PZT film is formed and 700 to 1200 sccm for the deposition of a BST film.

BEST MODE FOR CARRYING OUT THE INVENTION

First of all, embodiments of the mixing box and the first thin film-manufacturing system equipped with the mixing box according to the present invention will be described below in detail with reference to the accompanying drawings. The gases to be admixed in the mixing box will be described below, while taking a vaporized gas and a reactive gas by way of example.

Figure 1:
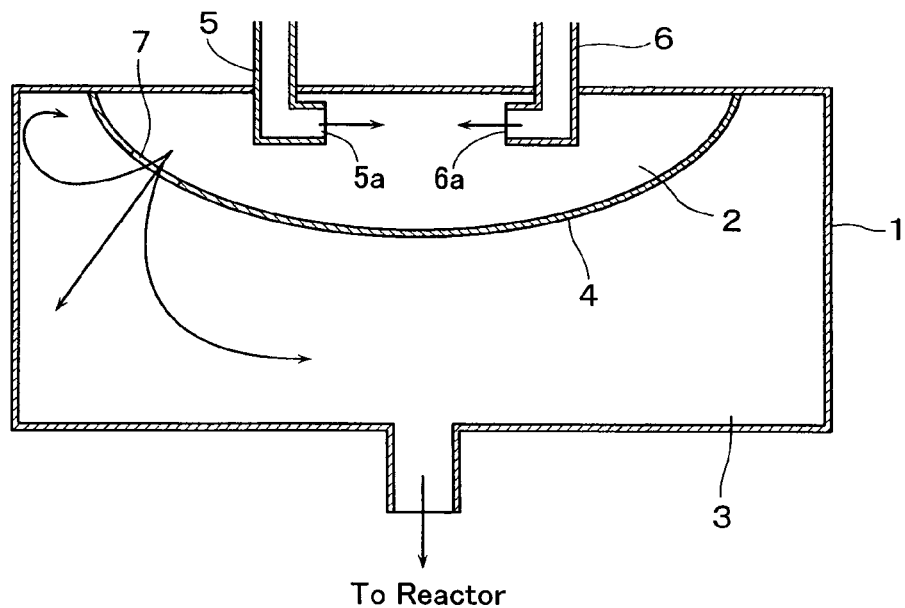
FIG. 1 is a cross sectional view schematically showing the internal structure of a mixing box according to an embodiment of the present invention.
Figure 3:
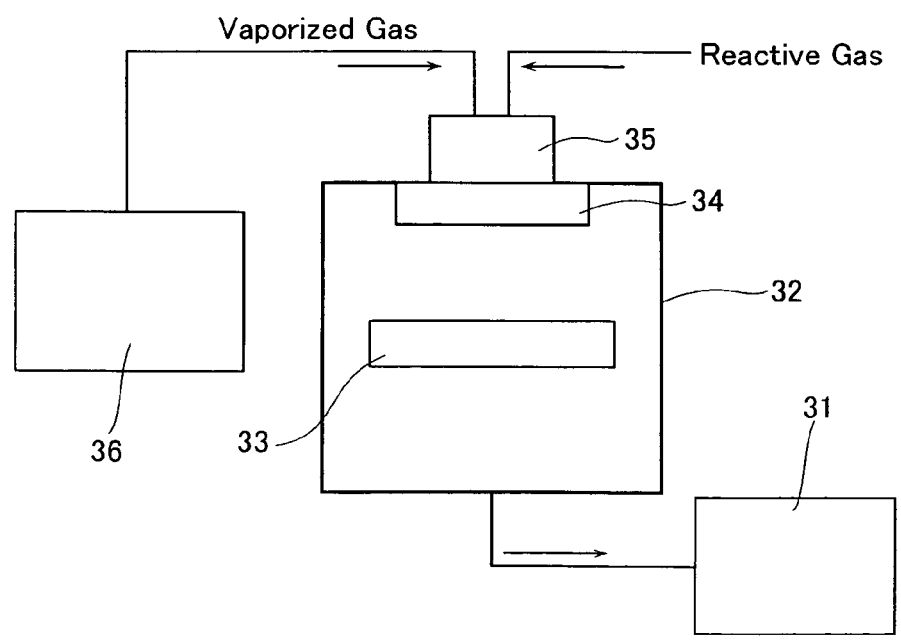
FIG. 3 is a block diagram showing the general construction of a first thin film-manufacturing system according to an embodiment of the present invention.
Figure 2A:
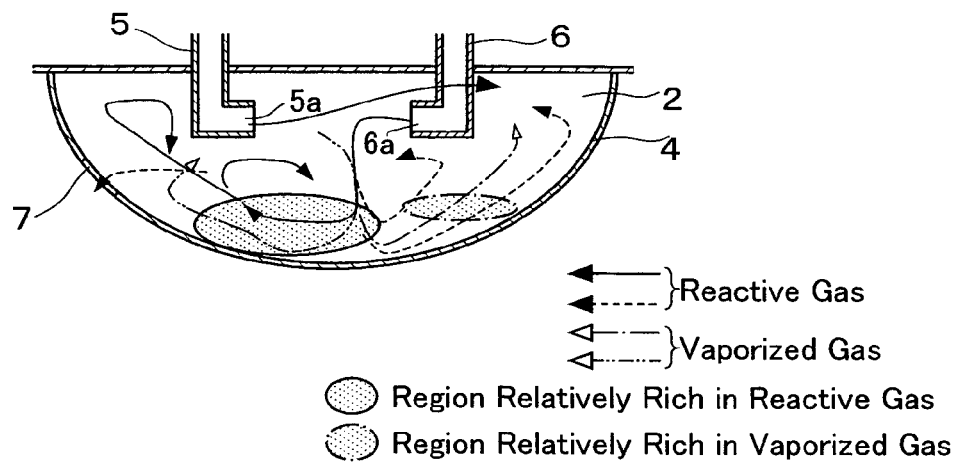
FIG. 2(A) is a cross sectional view schematically showing the internal structure of the stirring chamber of the mixing box according to an embodiment of the present invention.
Figure 2B:
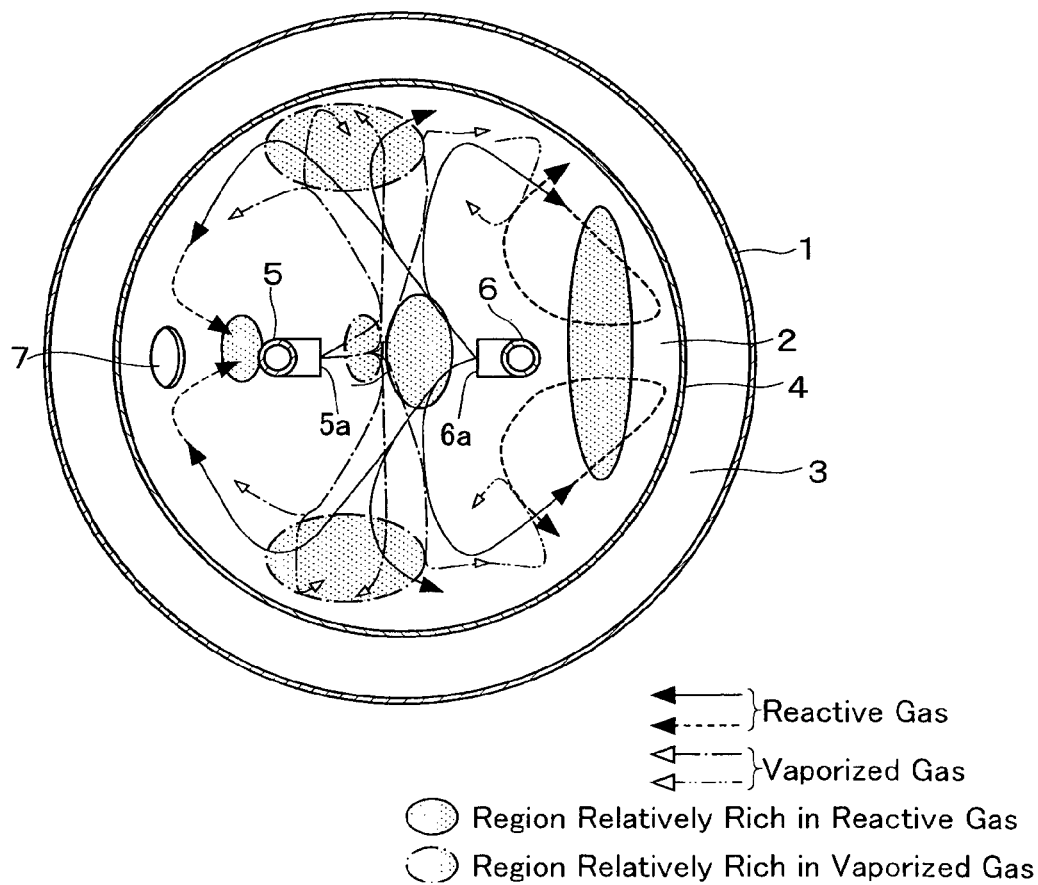
FIG. 2(B) is a top plan view schematically showing the internal structure of the stirring chamber shown in FIG. 2(A)

FIG. 1 is a cross sectional view schematically showing the internal structure of the mixing box according to an embodiment of the present invention; FIG. 2(A) is a cross sectional view schematically showing the internal structure of the stirring chamber of the mixing box according to an embodiment of the present invention; and FIG. 2(B) is a schematic top plan view showing the internal structure shown in FIG. 2(A). In addition, FIG. 3 is a block diagram showing the general construction of a first thin film-manufacturing system according to an embodiment of the present invention. In FIGS. 1 to 3, the same constituent elements are indicated by the same reference numerals. Incidentally, in FIGS. 2(A) and (B), arrows indicated by solid and dotted lines and alternate long and short dash lines and two-dot chain lines show tendencies of the results obtained in the fluid analysis according to the computer simulation of the reactive gas stream and the vaporized gas stream in relation to respective gas streams and gas distribution patterns.

As has been shown in FIG. 1, the mixing box 1 according to the embodiment of the present invention has a hollow cylindrical shape of a desired size, comprises a stirring chamber 2, a diffusion chamber 3 and a partition plate 4 for separating the stirring chamber from the diffusion chamber and is directly connected to a reactor for carrying out the subsequent processing using the resulting film-forming gas. A gas-introduction pipe 5 for the introduction of a plurality of vaporized gases and a reactive gas-introduction pipe 6 are fitted to the upper portion of the stirring chamber 2 and the gas-introduction inlets 5a and 6a thereof are arranged such that they are opposed to one another. The partition plate 4 is provided with a gas-supply opening 7 having a desired size and arranged at a desired position, which is on the lower side of the direction perpendicular to the straight line connecting the gas-introduction inlets 5a and 6a and which corresponds to about ½ time the vertical distance from the periphery of the foregoing partition plate 4 to the bottom thereof.

These vaporized gas-introduction pipe 5 and reactive gas-introduction pipe 6 are fitted to the upper wall surface of the mixing box 1 and at positions corresponding to the central portion (near the inflection point) of the partition plate 4, which are in a point symmetrical relation with respect to the central point of the partition plate 4, as will be seen from FIG. 1 and FIGS. 2(A) and (B) and the gas-introduction inlets 5a and 6a are arranged in such a manner that the gas-introduction directions thereof are opposed to one another.

In the foregoing mixing box, the partition plate 4 is formed into a semi-spherical shape having a convex partition plane like a quadratic curve and are fitted on the side of the upper wall surface of the mixing box to which the vaporized gas-introduction pipe 5 and the reactive gas-introduction pipe 6 are fitted.

The interior of the mixing box 1 is divided into the stirring chamber 2 and the diffusion chamber 3 and these chambers are designed in such a manner that the volume of the diffusion chamber 3 is larger than that of the stirring chamber 2. In this embodiment, the ratio of the volume of the stirring chamber 2 to that of the diffusion chamber 3 is not restricted to specific one, but it is preferred that the ratio in general ranges from 1:5 to about 1:2 for the achievement of satisfactory stirring, mixing and diffusion of gases used as a film-forming gas.

In the mixing box having the foregoing construction, a plurality of vaporized gases and a reactive gas may be introduced into the stirring chamber 2 of the mixing box 1 through the respective gas-introduction inlets 5a and 6a of the vaporized gas-introduction pipe 5 and the reactive gas-introduction pipe 6, while the reactor directly connected to the mixing box is evacuated. Thus, as shown in FIGS. 2(A) and (B), the vaporized gas stream is separated by the reactive gas stream within the stirring chamber 2, the both gases flow along the partition plate 4 on the surface thereof and as a result, a convection flow is generated so that the vaporized gases and the reactive gas are stirred and mixed together. Then as has been shown in FIG. 1, the film-forming gas comprising the mixed vaporized gas and reactive gas is smoothly introduced into the diffusion chamber 3 through the gas-supply inlet 7 and diffuses therein. As has been described above, the volume of the diffusion chamber 3 is larger than that of the stirring chamber 2 and therefore, the film-forming gas from the stirring chamber 2 is introduced into the diffusion chamber 3 and is diffused therein, because of the diffusion phenomenon of the gas due to the difference in volume between these chambers when the gas is transferred from the stirring chamber 2 to the diffusion chamber 3.

In the first thin film-manufacturing system according to this embodiment of the present invention, a wafer stage 33 for supporting a subject on which a thin film is to be deposited is placed and arranged within the reactor 32 of the vacuum-processing tank connected to a vacuum evacuation system 31, as shown in FIG. 3. A gas head 34 is fitted to the reactor 32 at the upper portion thereof and the gas head is directly connected to the mixing box 35, which is fitted to the vacuum-processing tank on the top thereof. In addition, this mixing box 35 is connected to a vaporized gas-vaporization system 36 and a reactive gas source. The film-forming gas uniformly admixed according to the foregoing method is introduced into the gas head, which is arranged in the proximity to the mixing box 35 and directly connected thereto in such a manner that the flow path thereof or the distance between the mixing box and the gas head is minimized or reduced to a level as short as possible, as shown in FIG. 3, and then fed to the surface of the subject, which is placed on the wafer stage 33 and on which a film is formed in the reactor without forming any laminar flow.

Since the foregoing mixing box is so designed that a vaporized gas and a reactive gas are stirred and mixed together in the stirring chamber 2 and then the film-forming gas thus prepared by stirring and mixing the gases is diffused in the diffusion chamber 3, the vaporized gas and the reactive gas can uniformly be admixed together even when these gases have molecular weights greatly different from one another. Therefore, it is not necessary to use a mixing box having a large volume. Accordingly, the volume of the mixing box is not largely influenced by the flow rate and kind of the film-forming gas and the mixing box can directly be connected to a reactor or a vacuum-processing chamber. For this reason, the uniformly admixed film-forming gas is never converted into a laminar flow.

When using the mixing box in accordance with this embodiment of the present invention, the gas-supply inlet 7 disposed on the partition plate 4 is positioned in the vicinity of the vaporized gas-introduction pipe 5, as shown in FIGS. 1, 2(A) and 2(B), the film-forming gas, which undergoes vigorous convection in this portion is smoothly introduced into the diffusion chamber 3 through the gas-supply inlet 7. In this respect, the gas-supply inlet 7 disposed on the partition plate 4 may likewise be arranged in the proximity to the reactive gas-introduction pipe 6. Moreover, since the volume of the diffusion chamber 3 is larger than that of the stirring chamber 2, the film-forming gas is uniformly admixed, because of the diffusion phenomenon of the gas due to the difference in volume between these chambers when the gas is transferred from the stirring chamber 2 to the diffusion chamber 3. The film-forming gas thus uniformly admixed is introduced into the gas head, which is arranged in the proximity to the mixing box and directly connected thereto in such a manner that the flow path thereof between the mixing box and the gas head is minimized and then fed to a substrate in the reactor without being returned back to any laminar flow.

The first thin film-manufacturing system according to this embodiment of the present invention is provided with a mixing box in which a partition plate having a specific shape is arranged and a film-forming gas obtained by stirring and mixing vaporized gas and reactive gas in the stirring chamber of the mixing box would spontaneously diffuse because of the diffusion phenomenon due to the difference in volume between the stirring chamber and the diffusion chamber, when the film-forming gas is introduced into the diffusion chamber. Accordingly, the use of this thin film-manufacturing device would make the construction of the method of the present invention quite simple and permit the easy practice of the method of the present invention.

The first thin film-manufacturing method of the present invention, which makes use of the foregoing thin film-manufacturing system, permits the direct introduction of a uniformly admixed film-forming gas into the reactor. Accordingly, the film-forming gas is never converted into any uncontrollable turbulent flow and the quality and thickness distribution of the resulting thin film can be improved and/or stabilized.

The present invention is not restricted to the specific embodiments described above at all and the present invention thus includes a variety of variations and modifications of these specific embodiments. For instance, a partition plate having a semi-spherical shape is used in the foregoing embodiments as the partition plate, but the features of the partition plate such as the curvature, shape (such as cylindrical, cubic and cone-like shapes) and size thereof may variously be changed depending on the kinds of gases used and processes selected.

Moreover, the position on which the gas-supply inlet to be disposed on the partition plate and the shape thereof can likewise be appropriately be changed depending on the processes inasmuch as the mixing box is designed in such a manner that the vaporized gas and the reactive gas are stirred and admixed and then uniformly introduced into the diffusion chamber. If a gas-supply inlet is positioned in the proximity to the portion at which the film-forming gas undergoes vigorous convection in the stirring chamber like the foregoing embodiment, the film-forming gas can smoothly introduced into the diffusion chamber. For instance, if a gas-supply inlet is positioned in a region falling within the range of from +45 degrees to −45 degrees as expressed in terms of the angle between the center of the line connecting the vaporized gas-introduction inlet and the reactive gas-introduction inlet and the upper and lower directions of the line, it is possible to uniformly admix these gases and to smoothly introduce the uniform gas mixture into the diffusion chamber.

In the foregoing embodiment, the partition plate is fitted to the mixing box such that any interstice is not formed between the partition plate and the wall surface on the gas-introduction side, but it is also possible to make an interstice between the periphery of the partition plate and the wall surface of the mixing box on the gas-introduction side so far as the film-forming gas is sufficiently stirred and admixed.

In addition, the foregoing embodiment has been described while taking a mixing box comprising one stirring chamber and one diffusion chamber by way of example, but it is also possible to admix the film-forming gas mixture using a mixing box comprising at least two stirring chambers and at least two diffusion chambers.

Moreover, it is likewise possible to directly introduce the film-forming gas from the stirring chamber into the reactor without passing through any diffusion chamber or using a mixing box free of any diffusion chamber depending on the required degree of the mixing condition to thus induce the reaction in the reactor.

The aforementioned method for preparing a thin film permits the formation of an electrode film using, for instance, Pt, Ir and Ru as a raw material; a barrier film such as that comprising a nitride film or an oxide film using, for instance, Ti, Ta and Al as a raw material; and a dielectric film represented by PZT, BST and SBT or the like. Moreover, to further improve the characteristic properties of the resulting thin film, other additives (sources of raw substances) such as La, Sr and Ca may be used.

The mixing box of the present invention is effective in, in particular, the MOCVD technique using a raw material, which is a liquid at ordinary temperature. This is because, such a raw material, which is a liquid at ordinary temperature, is heavy even in the vaporized state.

Figure 5:
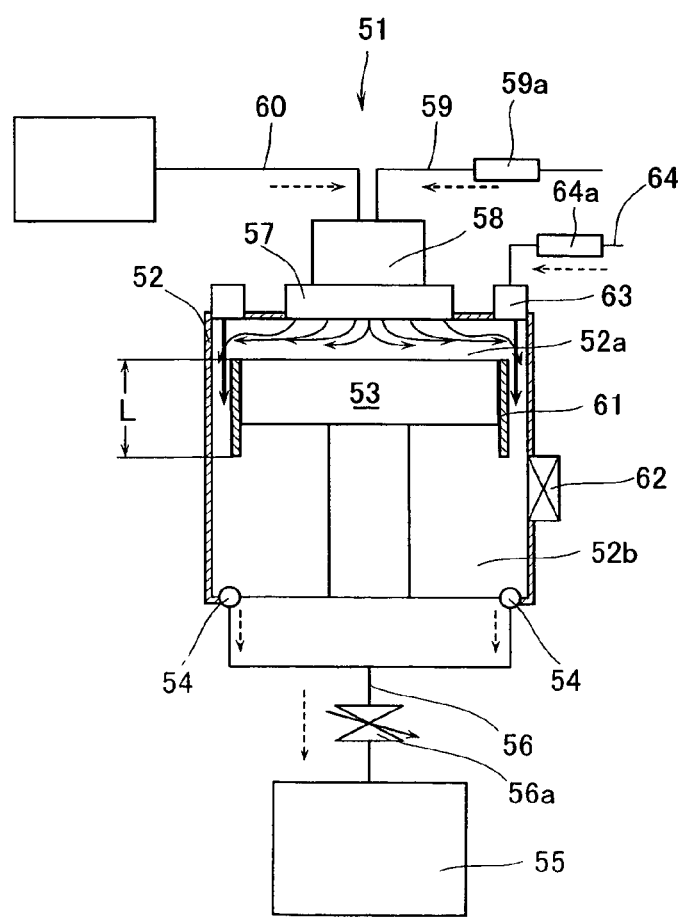
FIG. 5 is a block diagram showing the general construction of a second thin film-manufacturing system according to another embodiment of the present invention.
Figure 6A:
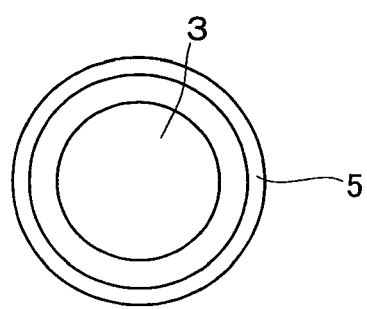
FIG. 6(A) is a top plan view showing the upper portion of the vacuum reactor shown in FIG. 5.
Figure 6B:
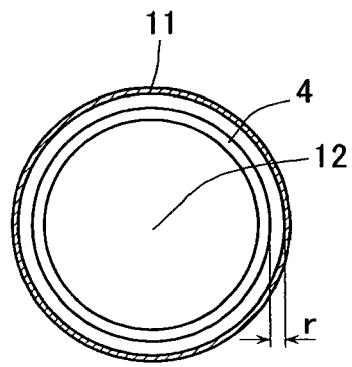
FIG. 6(B) is a cross sectional view showing the periphery of a stage shown in FIG. 5.

Then, the second thin film-manufacturing system according to an embodiment of the present invention will hereunder be described with reference to FIGS. 5 to 7. In FIGS. 5 to 7, the same reference numeral represents the same constituent element. This thin film-manufacturing system 51 comprises a cylindrical vacuum reactor 52 and a cylindrical stage 53 for placing a substrate such as a silicon wafer is disposed within the vacuum reactor. This stage 53 is provided with a heating means (not shown) such as a heater for heating the substrate.

Two exhaust ports 54 are formed on the lower side of the vacuum reactor 52 and a vacuum evacuation means 55 constituted by, for instance, a turbo molecular pump or a rotary pump is connected to the exhaust ports 54 through an exhaust pipe 56. Moreover, a gas head 57 is positioned at the central portion on the upper surface of the vacuum reactor 52 such that the gas head is opposed to the stage 53.

The mixing box 58 is connected to this gas head 57 at the upstream side thereof and a gas pipe 59 for a vaporized gas one end of which is connected to a vaporized gas source and a gas pipe 60 for a reactive gas one end of which is likewise connected to a reactive gas source are respectively connected to the mixing box 58 through the remaining ends. Then the vaporized gas and the reactive gas are fed to the mixing box 58 while controlling the flow rates of these gases by a mass flow controller (not shown) and the gas mixture uniformly admixed at a desired mixing ratio in the mixing box 58 is injected towards the central portion of the substrate through the gas head 57.

Incidentally, when forming a thin film on a substrate according to a CVD process such as the MOCVD process, if the temperature of the vaporized gas is reduced to not more than the evaporation point thereof, the vaporized gas is separated out in the form of powder and this becomes a cause of the dust-formation during the film-forming step within the vacuum reactor 52. For this reason, a heat exchanger 59a as a temperature control means is arranged in the gas pipe 59 for vaporized gas. Moreover, a heating means such as a heater may be arranged on the external wall of the vacuum reactor 52 and the stage in order to prevent any separation or deposition of the vaporized gas.

In this respect, to make, more uniform, the thickness distribution and compositional distribution of the thin film formed on a substrate according to the CVD process and to further improve the reproducibility of these distributions, it is quite important to isotropically evacuating the exhaust gas comprising, for instance, the mixed gas free of any contribution to the process from the circumference of the substrate and to thus make the gas flow from the gas head 57 to the vacuum exhaust means 55 uniform. To this end, it is in particular necessary to prevent the generation of any convection current, turbulent flow within a first space 52a existing below the gas head 57 and above the stage 53.

The second thin film-manufacturing system according to an embodiment of the present invention is designed in such a manner that a sleeve member 61 having a desired height L surrounds the stage 53. In this case, the volume of a second space 52b formed below the stage is set at a value larger than that of the first space 52a so that the exhaust gas is isotropically discharged through a circular interstice formed by the sleeve member 61 and the inner wall of the vacuum reactor 52. Moreover, in an isotropic exhaust port constituted by the sleeve member 61 and the outer peripheral wall thereof, the member of the outer peripheral portion may be formed from an anti-adhesive plate. In addition, a pressure control valve 56a may be disposed on the exhaust pipe 56 so that the pressure conditions may be adjusted depending on the CVD processes.

Figure 7A:
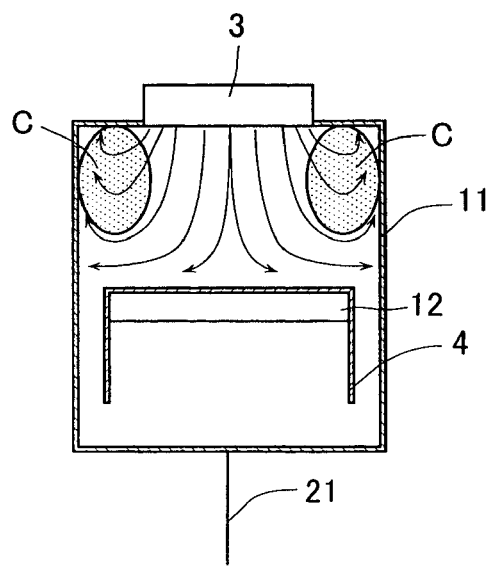
FIGS. 7(A) and (B) are diagrams for explaining the flow of a mixed gas observed when the position of the stage is changed within the vacuum reactor in the device shown in FIG. 5.
Figure 7B:
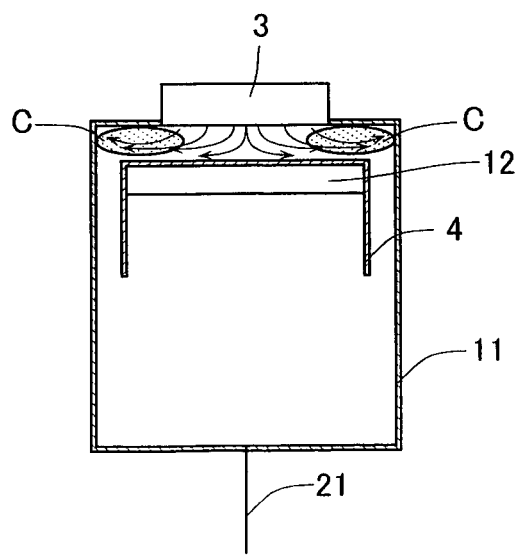

Regarding the height or position of the stage 53 in the vacuum reactor, if the distance between the gas head 57 and the stage 53 is too long as shown in FIG. 7(A), the exhaust gas is not completely discharged and accordingly, a convection current C may be generated at the upper corner of the vacuum reactor 52. On the other hand, if the distance between the gas head 57 and the stage 53 is too short as shown in FIG. 7(B), the mixed gas injected from the gas head 57 is reflected by the substrate and thus a convection current C may be generated at the upper corner of the vacuum reactor 52. For this reason, it is necessary to set the distance between the gas head 57 and the stage 53 during the film-forming step at such a level that any such convection current C cannot easily be generated.

Moreover, if a substrate-conveying port 62 for transporting the substrate to the stage 53 is arranged in such a region that the port is confronted by the first space 52a, a turbulent flow is generated at the periphery of the substrate-conveying port 62. For this reason, it would be favorable that a means for ascending and descending the stage is disposed on the stage 53 so that the stage 53 can freely go up and down between the film-forming position on the upper side of the vacuum reactor 52 and the substrate-transporting position on the lower side of the reactor. Then the substrate-conveying port 62 is arranged at a desired position on the side wall of the vacuum reactor 52 corresponding to the substrate-transporting position.

In this respect, if a heating means for heating a substrate to a desired temperature is incorporated into the stage 53, heat convection may be generated above the substrate. In this embodiment, a gas ring 63 for uniformly introducing an inert gas into the vacuum reactor 52 along the inner wall of the reactor 52 is positioned above the vacuum reactor 52 in such a manner that the ring may surround the gas head 57.

The injection of an inert gas through the gas ring 63 would permit more isotropic reliable discharge of the exhaust gas, which passes through the interstice formed between the sleeve member 61 and the inner wall surface of the vacuum reactor 52 and is then discharged into the second space 52b, from the periphery of the sleeve member 61, due to the compulsory rectifying action of the inert gas. Thus, the occurrence of any turbulent flow, convection current and heat convection in the first space can surely be eliminated. Incidentally, in this embodiment, the volume of the first space observed when the stage 63 is in the film-forming position is set at 2.8 L, while the volume of the second space is set at 13 L.

In this case, a temperature control means, for instance, a heating means such as a heater or a heat exchanger 64a can be fitted to the gas pipe 64 communicated with the gas ring so that the temperature of the inert gas injected from the gas ring 63 can be controlled to thus prevent any separation of the vaporized gas in the form of powder in the CVD process such as the MOCVD process.

The present invention will hereunder be described in more detail with reference to the following Examples and Comparative Examples.

EXAMPLE 1

PZT thin films were prepared using thin film-manufacturing systems shown in FIG. 3 provided with a mixing box 1 (corresponding to the mixing box 35 in the figure) as shown in FIG. 1, FIGS. 2(A) and 2(B) while taking, by way of example, a case in which a vaporized gas for PZT as a ferroelectric substance and oxygen gas ($O_2$) as a reactive gas are admixed together, in which the kinds and the set values of flow rates of the vaporized gases were as follows:

| Vaporized Gas | Conc. (mol/L) | Set Flow Rate (mL/min) |
| --- | --- | --- |
| Pb(DPM)$_2$/THF | 0.3 | 0.6 |
| Zr(DPM)$_4$/THF | 0.3 | 0.3 |
| Ti(i-PrO)$_2$(DPM)$_2$/THF | 0.3 | 0.3 |
| Carrier Gas: N$_2$ | — | 500 sccm |
| Reactive Gas: O$_2$ | — | 2000 sccm |

Note:
DMP: dipivaroyl methanato, $C_{11}H_{19}O_2$;
THF: tetrahydrofuran, $C_4H_8O$;
i-PrO: isopropoxy group.

The pressure in the reactor was adjusted to 6 Torr. At this stage, the pressure in the diffusion chamber of the mixing box was found to be 13 Torr, while that in the region for obtaining the vaporized gas was found to be 18 Torr. In general, stable vaporization of a liquid material desirably takes place at a pressure of not more than 30 Torr and therefore, the foregoing completely satisfied this requirement.

Figure 4A:
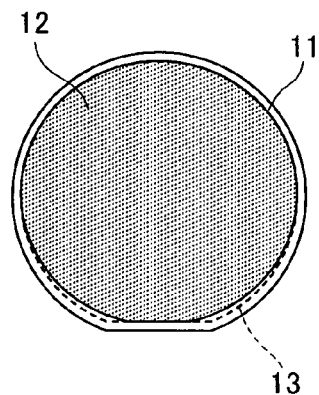
FIG. 4(A) is a schematic diagram showing the outline of the thickness distribution observed for the thin film formed in Example 1.

The foregoing vaporized gas and reactive gas were introduced into a mixing box 1 provided with a semi-spherical partition plate 4, as shown in FIGS. 1, 2(A) and 2(B), from the gas-introduction ports 5a and 6a through the gas-introduction pipes 5 and 6, respectively to thus stir, mix and diffuse the gases, followed by the introduction of the resulting film-forming gas prepared in the mixing box 1 into the reactor in which a PZT thin film was formed on a substrate according to the MOCVD technique, which was conducted under the usual conditions. The thickness distribution of the resulting thin film is roughly depicted on FIG. 4(A). In the figure, the numerical values 11, 12 and 13 represent a substrate, thick film regions and thin film regions, respectively. As will be clear from this figure, the use of a mixing box provided therein with a partition plate 4 permitted the continuous formation of a uniform film on the substrate 11. In this case, the deviation in the film thickness distribution was found to be ±1.2% and thus, the resulting film completely satisfied such a condition of not more than ±3% required for improving the yield of semiconductor chips from the viewpoint of device manufacture. These results clearly indicate that the use of a desired partition plate 4 permits the efficient convection, stirring, mixing and diffusion of gases in the stirring chamber 2 and the diffusion chamber 3; the formation of a uniform gas mixture comprising a vaporized gas and a reactive gas; and the formation of a thin film having a uniform thickness.

Moreover, the same procedures used above were repeated while changing the concentrations of the vaporized gas and the set flow rates of the reactive gas, but the results obtained were almost identical to those obtained above.

COMPARATIVE EXAMPLE 1

Figure 4B:
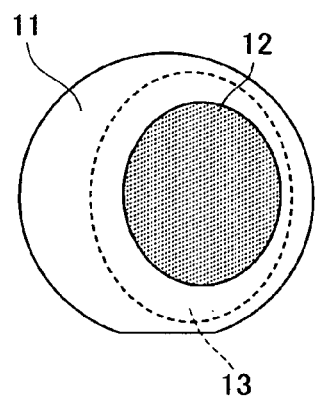
FIG. 4(B) is a schematic diagram showing the outline of the thickness distribution observed for the thin film formed in Comparative Example 1.

A PZT thin film was formed according to the procedures identical to those used in Example 1, except that a conventional mixing box free of any partition plate was used, the same vaporized gas and reactive gas were introduced into the mixing box, followed by mixing and diffusing the same and the formation of a thin film according to the MOCVD technique. The thickness distribution of the thin film thus prepared is roughly depicted on FIG. 4(B). In this figure, reference numerals 11, 12 and 13 are the same as those explained above in connection with FIG. 4(A). In this case, thicker film regions 12 formed on a substrate 11 were unevenly distributed on the side of the reactive gas-introduction port, while thinner film regions 13 were unevenly distributed on the vaporized gas-introduction port. A phenomenon in which regions having a relatively high concentration of each gas were inverted with respect to the positions of the gas-introduction ports took place at the bottom of a space in the mixing box (the total space of the stirring and diffusion chambers in case where a partition plate is fitted to the box), unlike the fluid analysis shown in FIGS. 2(A) and 2(B) and the inversion phenomenon was maintained from the film-forming gas exhaust port to the gas head in a laminar flow state and accordingly, it would be assumed that the concentration distribution was transferred to the substrate. In this case, the deviation in the film thickness distribution was found to be ±6.3%, which was not less than two times that required for the improvement of the yield of semiconductor chips (not more than ±3%) from the viewpoint of the device manufacture and therefore, the resulting film could not be acceptable as a material for device manufacture.

Moreover, in this case wherein any partition plate was not fitted to the mixing box, the same procedures used above were repeated while changing the concentrations of the vaporized gas and the set flow rates of the reactive gas like Example 1. As a result, it was found that the difference in film thickness between the thinner and thicker portions of the resulting film increased as the set flow rates of the vaporized gas and reactive gas increased and that the area and shape of the thicker film portion varied and there was not observed any reproducibility. Moreover, even in cases wherein a film was continuously formed, such a tendency that the thicker film regions were unevenly distributed on the side of the reactive gas-introduction port was observed, although the area of the thicker film region varied.

EXAMPLE 2

The same procedures used in Example 1 were repeated to form a BST thin film except that a vaporized gas for BST as a ferroelectric substance and oxygen gas ($O_2$) as a reactive gas were admixed together, in which the kinds and the set values of flow rates of the vaporized gases were as follows:

| Vaporized Gas | Conc. (mol/L) | Set Flow Rate (mL/min) |
|---|---|---|
| Ba(DPM)$_2$/THF | 0.1 | 0.3 |
| Sr(DPM)$_4$/THF | 0.1 | 0.3 |
| Ti(i-PrO)$_2$(DPM)$_2$/THF | 0.1 | 0.6 |
| Carrier Gas: N$_2$ | — | 250 sccm |
| Reactive Gas: O$_2$ | — | 1800 sccm |

As in the case of Example 1, BST thin films were produced using a thin film-manufacturing system provided with a mixing box equipped therein with a partition plate and the same tendency obtained in Example 1 was observed for the film thickness distribution of the BST films thus formed and the use of the thin film-manufacturing system provided with the mixing box of the present invention permitted efficient, continuous deposition of a thin film having a uniform film thickness distribution. The resulting film completely satisfied the requirement concerning the film thickness distribution (±3%).

COMPARATIVE EXAMPLE 2

A BST thin film was formed according to the procedures identical to those used in Example 2, except that a conventional mixing box free of any partition plate was used, the same vaporized gas and reactive gas were introduced into the mixing box, followed by mixing and diffusing the same and the formation of a thin film according to the MOCVD technique. The thickness distribution observed for the resulting film was considerably higher than ±3% as in the case of Comparative Example 1.

EXAMPLE 3

The same procedures used in Example 1 were repeated except that Zr(DMHD)$_4$/THF was substituted for the Zr(DPM)$_4$/THF used in Example 1 as a vaporized gas for PZT as a ferroelectric substance. In this respect, "DMHD" means dimethyl heptadionato ($C_7H_{13}O_2$). The film quality and thickness distribution of the resulting thin film showed tendencies identical to those observed in Example 1. In other words, the use of the thin film-manufacturing system provided with the mixing box of the present invention permitted the efficient and continuous deposition of a thin film having a uniform thickness distribution. The resulting thin film completely satisfied the requirement for the thickness distribution (±3%).

EXAMPLE 4

An example in which a PZT thin film was prepared according to the MOCVD technique using the second thin film-manufacturing system 51 of the present invention as shown in FIG. 5 will be described below. The concentrations and flow rates of vaporized gases for Pb, Zr and Ti as well as the flow rates of a carrier gas N$_2$ and a reactive gas O$_2$ used in this Example are specified below. Thus, a PZT film was deposited on an electrode substrate having a diameter of 8 inches. In this connection, the pressure in the vacuum reactor 52 was maintained at 5 Torr using a pressure-control valve 56a.

| Vaporized Gas | Conc. (mol/L) | Set Flow Rate (mL/min) |
|---|---|---|
| Pb(DPM)$_2$/THF | 0.3 | 1.14 |
| Zr(DMHD)$_4$/THF | 0.3 | 0.58 |
| Ti(i-PrO)$_2$(DPM)$_2$/THF | 0.3 | 0.67 |
| Carrier Gas: N$_2$ | — | 500 sccm |
| Reactive Gas: O$_2$ | — | 2500 sccm |
| Inert Gas: N$_2$ | — | 0 to 4000 sccm |

Figure 8:
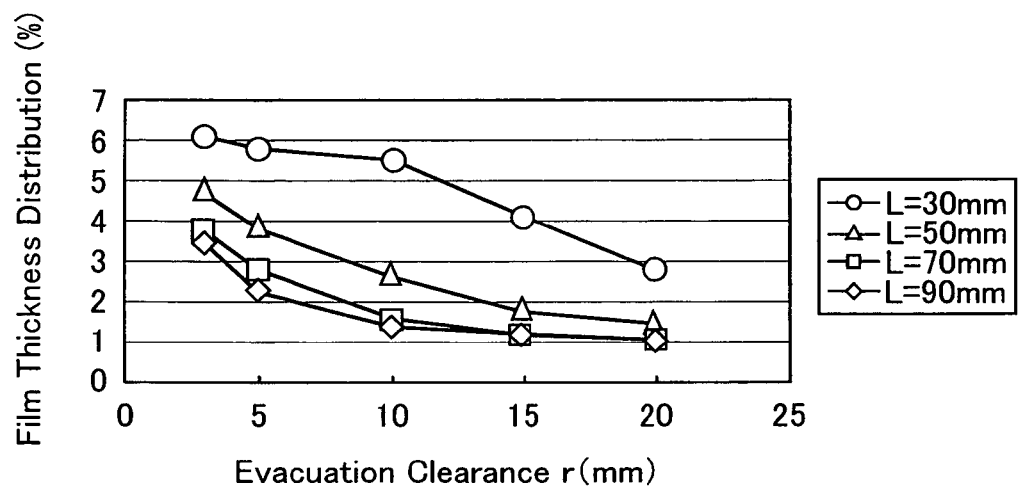
FIG. 8 is a graph showing the film thickness distribution observed when PZT films are formed while changing the dimension of the interstice and height in the second thin. film-manufacturing system according to the present invention.
Figure 9:
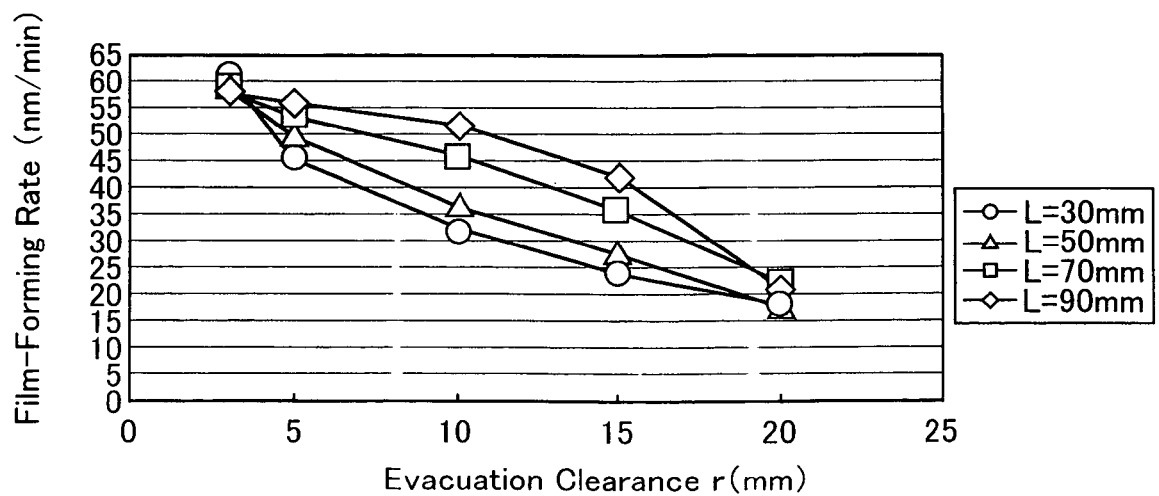
FIG. 9 is a graph showing the film-forming rate observed at the center of a substrate when PZT films are formed while changing the dimension of the interstice and height in the second thin film-manufacturing system according to the present invention.

FIG. 8 shows the film thickness distribution observed when a PZT film having a thickness of 100 nm was prepared while changing (30, 50, 70, 90 mm) the size of the interstice "r" (evacuation clearance r (mm)) formed between the inner wall surface of the vacuum reactor 52 and the sleeve member 61 and the height L (mm) of the sleeve member 61. On the other hand, FIG. 9 shows the film-forming rates at the center of the substrate observed when forming PZT films while changing the interstice r and the height L (30, 50, 70, 90 mm).

As will be clear from the data shown in FIG. 8, to maintain the film thickness distribution within 2%, the interstice r should be set at a level of not less than 10 mm when the height L is not less than 70 mm. On the other hand, the film-forming time is desirably not more than 3 minutes while taking into consideration the mass production ability and therefore, the film-forming rate should be controlled to not less than 35 nm/min when forming a thin film having a film thickness of 100 nm. Accordingly, the measured results shown in FIG. 9 indicate that good film thickness distribution and the film-forming rate suitable for the mass production can be obtained if the size r of the interstice is set at a level of not less than 10 mm and preferably 10 to 17 mm; and the height L of the sleeve member is set at a level of not less than 70 mm.

Figure 10:
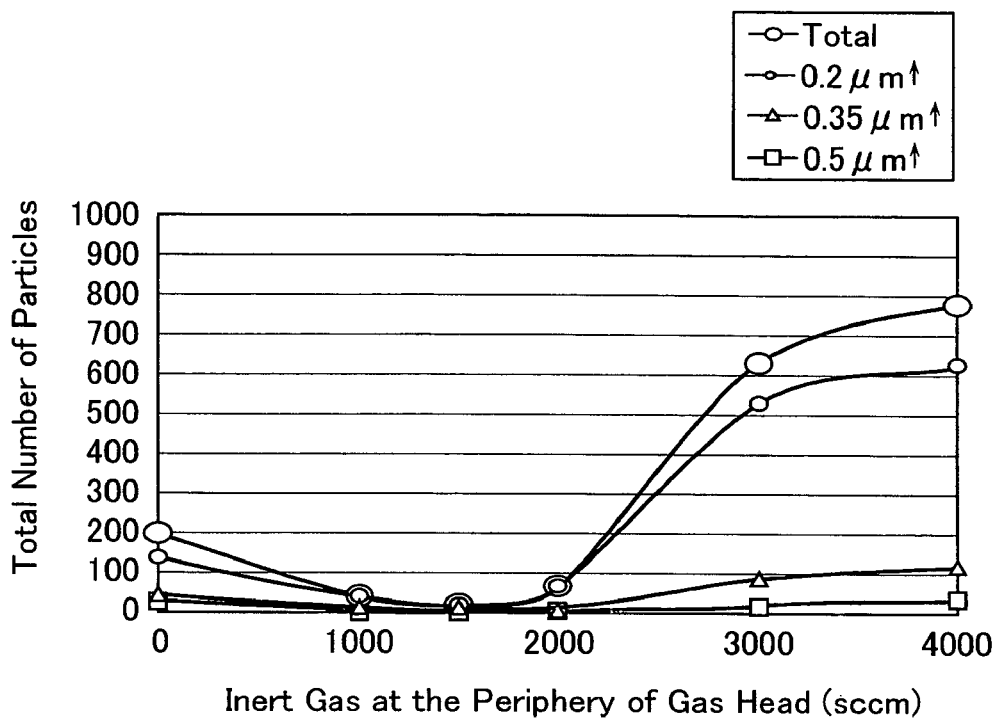
FIG. 10 is a graph showing the relation between the film thickness distribution and the dust generated during the film-forming step observed when PZT films are formed on an electrode substrate having a size of 8 inches in the second thin film-manufacturing system according to the present invention while an inert gas N2 is fed to the vacuum reactor of the device through a gas ring at a flow rate ranging from 0 to 4000 sccm.

Then the size of the interstice r was set at 15 mm and the height L of the sleeve member was set at 70 mm, among the foregoing conditions and an inert gas N$_2$, which did not contribute to the film-forming process was introduced into the vacuum reactor 52 through the gas ring 63 arranged at the periphery of the gas head 57 to thus determine the film thickness distribution and dust generated during the film-forming process. FIG. 10 shows the relation between the film thickness distribution and the film-forming dust observed when a PZT film was formed on an electrode substrate having a diameter of 8 inches, while changing the flow rate of the inert gas within the range of from 0 to 4000 sccm. The data plotted on FIG. 10 indicate that the number of particles was minimized when the flow rate of the inert gas introduced into the vacuum reactor through the gas ring 63 ranged from 1000 to 2000 sccm. This clearly indicates that the use of inert gas is effective as compared with the case in which any inert gas is not used.

Figure 11:
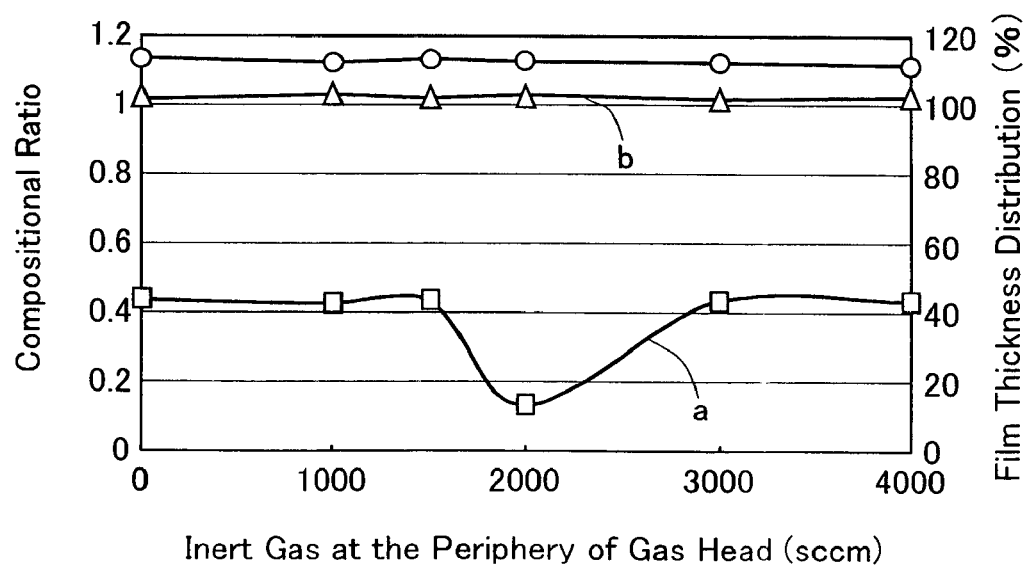
FIG. 11 is a graph showing the relation between the compositional distribution and the film thickness distribution observed when PZT films are formed on an electrode substrate having a size of 8 inches in the second thin film-manufacturing system according to the present invention while an inert gas N2 is fed to the vacuum reactor of the device through a gas ring at a flow rate ranging from 0 to 4000 sccm.

FIG. 11 shows the compositional ratio (line a) and the film thickness distribution (line b) observed when the size of the interstice r was set at 15 mm and the height of the sleeve member L was set at 70 mm like the foregoing case and an inert gas N2 was introduced into the vacuum reactor 52 through the gas ring 63, while changing the flow rate thereof within the range of from 0 to 4000 sccm to thus form or deposit PZT films on an electrode substrate having a diameter of 8 inches. The data shown in FIG. 11 indicate that there was not observed any change in the film thickness distribution even when changing the flow rate of the inert gas, but the compositional ratio went out of order in the proximity to the flow rate of the inert gas of 2000 sccm. In this connection, the term "compositional ratio" herein used means the ratio: Zr/(Zr+Ti).

The foregoing measured results clearly indicate that in the second thin film-manufacturing system according to the foregoing embodiment, the inert gas per se introduced into the reactor through the gas ring 63 never became a cause of any turbulent flow and/or convection flow and the inert gas showed the highest possible rectifying action if the size of the interstice r was set at a level of not less than 10 mm, the height L of the sleeve member 61 was set at a level of not less than 70 mm and the flow rate of the inert gas introduced into the reactor from the gas ring 63 was controlled to the range of from 1000 to 1500 sccm. As a result, this film-manufacturing system permitted the achievement of excellent and stable thickness distribution (not more than 2%), compositional ratio, compositional distribution and film-forming rate of the resulting thin film, the considerable reduction of the dust generated during the film-forming process (the number of particles having a particle size of not less than 0.2 μm is not more than 20) and the continuous film-forming procedures.

EXAMPLE 5

BST films were formed under the conditions specified below. The inert gas per se introduced into the reactor through the gas ring 63 never became a cause of any turbulent flow and/or convection flow and the inert gas showed the highest possible rectifying action if the size of the interstice r was set at a level of not less than 10 mm, the height L of the sleeve member 61 was set at a level of not less than 70 mm and the flow rate of the inert gas introduced into the reactor from the gas ring 63 was controlled to the range of from 700 to 1200 sccm, like the case described in Example 4. In this case, the pressure in the vacuum reactor 52 was maintained at 8 Torr.

| Vaporized Gas | Conc. (mol/L) | Set Flow Rate (mL/min) |
|---|---|---|
| Ba(DPM)$_2$/THF | 0.1 | 0.3 |
| Sr(DMD)$_4$/THF | 0.1 | 0.3 |
| Ti(i-PrO)$_2$(DPM)$_2$/THF | 0.1 | 0.6 |
| Carrier Gas: N$_2$ | — | 250 sccm |
| Reactive Gas: O$_2$ | — | 1800 sccm |
| Inert Gas: N$_2$ | — | 1000 sccm |

Moreover, even if any ascending and descending means is not fitted to the stage 53, a uniform mixed gas stream can be obtained by arranging an anti-adhesive plate to thus isotropically discharge the exhaust gas without generating any convection current, turbulent flow and heat convection.

INDUSTRIAL APPLICABILITY

The mixing box of the present invention is designed in such a manner that it comprises a stirring chamber in which two gas-introduction pipes are arranged in such a manner that the gas-introduction inlets thereof are opposed to one another and a diffusion chamber for diffusing a gas mixture formed by the stirring and mixing operations in the stirring chamber, that a partition plate having a specific curved shape is positioned between the stirring chamber and the diffusion chamber, that a gas-supply opening is arranged, on the partition plate, at a desired position on the lower side of the direction perpendicular to the straight line connecting the gas-introduction inlets and that the mixed gas is diffused from the stirring chamber to the diffusion chamber through the gas-supply opening. Therefore, the mixing box permits the easy and uniform mixing of gases having different masses; it is not necessary to increase the volume of the mixing box used even if the gases have different masses; and the volume of the mixing box is not necessarily changed depending on the flow rates and kinds of gases used. Accordingly, the use of this mixing box would permit the efficient deposition of thin films having uniform film quality and thickness distribution according to the CVD techniques such as MOCVD. A gas-supply opening is disposed at the position, on the partition plate having a curved shape, corresponding to ½ time the vertical distance between the peripheral portion of the partition plate and the bottom thereof and this would permit the easy and uniform mixing of gases having different masses and the efficient use of the resulting mixed gas in the subsequent step.

The thin film-manufacturing system according to the present invention is equipped with a mixing box as has been described above, which can admix a vaporized gas and a reactive gas uniformly and therefore, a vacuum reactor can directly be connected to the mixing box and this makes the construction of the system quite simple. In addition, since the thin film-manufacturing system is equipped with the foregoing mixing box, this permits the reduction of the internal pressure in the mixing box during mixing and this in turn permits the reduction of the internal pressure in the vaporizer to a level of not more than a predetermined value. For this reason, the cycle for the maintenance of the vaporization region of the device can considerably be extended, the resulting stable film-forming gas mixture can be fed to the reactor and as a result, a thin film having uniform film quality and film thickness distribution can be prepared according to the CVD process.

Moreover, the thin film-manufacturing system of the present invention has a simple structure and can be produced at a low cost. In addition, the system can inhibit the generation of any turbulent flow, convection current and/or heat convection to thus form a uniform gas stream of a gas mixture. Accordingly, the system can make the film thickness distribution and compositional distribution of the thin film formed on a substrate quite uniform and the system likewise permits the achievement of high reproducibility and the device can efficiently be used in the CVD processes such as the MOCVD process.

What is claimed is:

1. A mixing chamber comprising:
   a stirring chamber for stirring and mixing gases in which two gas-introduction pipes for introducing gases having different masses are arranged in such a manner that the gas-introduction inlets thereof are opposed to one another on a same line, each gas-introduction pipe having an inlet side and a side opposite the inlet side;
   a diffusion chamber for diffusing a gas mixture formed by the stirring and mixing operations in the stirring chamber; and
   a partition plate positioned between the stirring chamber and the diffusion chamber in such a manner that the volume of the diffusion chamber is larger than that of the stirring chamber,
   wherein a gas-supply opening is configured and arranged in the partition plate,
   wherein the gas mixture obtained in the stirring chamber is allowed to flow into the diffusion chamber through the gas-supply opening,
   wherein the gas-supply opening is formed in the partition plate substantially on the same line, as seen in plan view, connecting both the gas-introduction inlets, and
   wherein the gas-supply opening is closer to the opposite side than the inlet side of one of the gas-introduction pipes along the same line.

2. The mixing chamber according to claim 1, wherein each of the gases introduced from each of the corresponding gas-introduction pipes have a different gas flow rate.

3. The mixing chamber according to claim 1, wherein the partition plate has a shape of a curve of second degree toward the diffusion chamber.

4. The mixing chamber according to claim 3, wherein the gas-supply opening is arranged at a position corresponding to ½ a vertical distance from a periphery of the partition plate to a bottom.

5. The mixing chamber according to claim 1, wherein the two gas-introduction pipes comprise a vaporized gas-introduction pipe, and a reactive gas-introduction pipe, and the mixed gas is a film-forming gas.

6. A thin film manufacturing apparatus comprising the mixing chamber according to claim 1, and a vacuum reactor directly connected to the diffusion chamber of the mixing chamber.

7. A mixing chamber comprising:
   a stirring chamber for stirring and mixing gases in which two gas-introduction pipes for introducing gases having different masses are arranged in such a manner that the gas-introduction inlets thereof are opposed to one another on a same line;
   a diffusion chamber for diffusing a gas mixture formed by the stirring and mixing operations in the stirring chamber; and
   a partition plate positioned between the stirring chamber and the diffusion chamber in such a manner that the volume of the diffusion chamber is larger than that of the stirring chamber,
   wherein a gas-supply opening is configured and arranged on the partition plate,
   wherein the gas mixture obtained in the stirring chamber is allowed to flow into the diffusion chamber,
   wherein the partition plate has a shape of a curve of a second degree toward the diffusion chamber, and
   wherein the gas-supply opening is arranged at a position corresponding to ½ a vertical distance from a periphery of the partition plate to a bottom.

* * * * *